United States Patent [19]

Marusa et al.

[11] Patent Number: 4,862,159
[45] Date of Patent: Aug. 29, 1989

[54] CENTRALIZED SYSTEM FOR SELECTING AND REPRODUCING PERCEPTIBLE PROGRAMS

[75] Inventors: David M. Marusa, Santa Fe, N. Mex.; Bruce R. Munroe, Rolling Hills, Calif.

[73] Assignee: Audio Technology, Inc., Palos Verdes, Calif.

[21] Appl. No.: 182,388

[22] Filed: Apr. 18, 1988

[51] Int. Cl.$^4$ .............................................. H04Q 1/00
[52] U.S. Cl. ........................ 340/825.24; 340/825.25; 381/105
[58] Field of Search ............... 381/105, 109; 434/308, 434/319; 340/825, 825.03, 825.08, 825.24, 825.25; 455/3, 4

[56] References Cited

U.S. PATENT DOCUMENTS

| | | | |
|---|---|---|---|
| 3,156,770 | 11/1964 | Trainer | 381/109 X |
| 4,228,402 | 10/1980 | Plummer | 381/105 X |
| 4,371,750 | 2/1983 | Markley | 381/105 X |
| 4,504,933 | 3/1985 | Janney | 381/105 X |
| 4,621,374 | 11/1986 | Micic et al. | 381/105 X |

Primary Examiner—Ulysses Weldon
Attorney, Agent, or Firm—Matthew F. Jodziewicz

[57] ABSTRACT

A system for selecting and reproducing audio, video, or other humanly perceptible programs comprises a program source providing a multiplicity of program signals, a plurality of stations at which individual programs may be reproduced, a switching mechanism for selectively connecting selected program signals to the reproducing device at each station, and a microprocessor control unit operable upon user generated commands from each of the stations for controlling the switching mechanism in accordance with a user programmable set of instructions.

12 Claims, 6 Drawing Sheets

CENTRALIZED SYSTEM FOR SELECTING AND REPRODUCING PERCEPTIBLE PROGRAMS

BACKGROUND OF THE INVENTION

1. Field of the Invention

This invention relates in general to a system for providing persons located at a plurality of individual stations with perceptible programs, the persons at each station being capable of selecting, from a plurality of programs and types of program devices available at a remote source, programs to be received and reproduced at the stations by manipulating a control pad or similar mechanism, and, deals more particularly, with a centralized entertainment system for the economical distribution of entertainment programs throughout several rooms in a dwelling, hotel, school, or other building, in which a station control pad is located in each room for controlling a desired entertainment program in the room by a user entering commands through the station control pads to the system.

2. Description of the Related Art

A system embodying this invention has use in many situations, ranging from a dwelling to a school language laboratory where a number of users from a plurality of different stations may selectively access different programs from a number of pre-set or randomly accessible user selected program sources or channels.

While there have been other centralized systems for providing selected programs to specified stations, none have enabled a user to select desired programs utilizing a microprocessor control unit operable in accordance with a pre-set set of instructions to permit the user's particular station to choose its program within specific limitations, such as, timer elements for daily or single listening, volume levels for a particular station, and sharing or restriction arrangements among specified stations.

SUMMARY OF THE INVENTION

An object of the present invention is to provide a system for supplying persons located at a plurality of stations with perceptible programs, the persons being capable of selecting, from a plurality of programs and types of program devices available at a remote source, programs to be received and reproduced at such station, by manipulating a control pad or similar mechanism.

Another object of the present invention is to provide a centralized entertainment system for the economical distribution of entertainment programs throughout one or several rooms in a dwelling, hotel, school, or other building, where a selected entertainment program may be received and caused to operate a loudspeaker located in the room by a user entering commands through the station control pads to the system.

Yet another object of the present invention is to provide a system for supplying a plurality of users located at a plurality of individual stations with perceptible programs which includes a programmable microprocessor controller device for multiple devices having a specific application in the system as a centralized controller for managing a number of audio devices, such as tape decks, tuners, compact disc players, etc., from any of a plurality of individual rooms or stations, each room or station having a controller entry pad that allows an individual to choose which of the device types that will have its program signal directed into that particular room or to that particular station.

Still another object of the present invention is to provide a commercial system for providing entertainment services for homes and the like facilities where each occupant can control the entertainment program that is being presented in their own particular area surrounding their station, or, with some restrictions, throughout selected areas being served by the system.

In summary, the invention is embodied in a system for providing selected programs to specified areas serviced by the system. The system contains a plurality of program sources, each providing a user selectible program signal located at a single, remote location. A power supply unit is adapted to be connected to both a source of power and to each of the program sources. The power supply unit is further adapted to respond to a power control signal to either enable or disable a selected program source. A control pad is located at each of the uniquely identified stations. Each pad includes a plurality of switch means and means for generating a program call signal in response to the actuation of each switch means by a user. Each pad also includes means for producing a program call signal having a first portion for uniquely identifying the station for which the program call signal is being generated, a second portion identifying the type of program source being selected by the user, and a third portion identifying a volume level or line level out. A microprocessor control unit is coupled to both the power supply unit and to the plurality of control pads. It is operable upon the receipt of a program call signal from each of the control pads in accordance with a set of pre-set instructions for: (1) generating the power control signal to enable or disable a selected program source based upon the second portion of the program call signal; (2) generating a routing signal for use by a switching device based upon the first portion of the program call signal; and, (3) generating a volume or line level out control signal for use by a transducing means based upon the third portion of the program call signal. A plurality of transducing means are coupled to the microprocessor control unit, and are each located at the stations for converting a received program signal to a sensibly perceptible program for the user. Each of the transducing units are adapted to respond to the volume level control (or line level out) signal for controlling the volume level of the sensibly perceptible program at the station. A switching device is coupled to the microprocessor control unit, to the plurality of program sources and to the plurality of transducing units. The switching device is adapted to respond to the routing signal for connecting the selected program source to at least one selected transducing unit.

The invention may be embodied in a system wherein the microprocessor control unit is operatively connected through a common wideband bus to a plurality of devices, such as tuners having manually pre-set or randomly accessible user selected channels, tape players, compact disc players, etc., and to a plurality of amplifiers feeding the chosen program signal output chosen into a selected area. Each individual room or area may have an entry pad that permits a user to choose the device type or program they wish directed into the specified room or area.

In operation, an individual enters a room and selects, by entering the appropriate commands into the keypad of the entry pad, that he wishes to have a certain specified type of device, such as an FM tuner, for example, direct a musical program into the room. The user entered command is interpreted by the microprocessor control unit in accordance with a pre-programmed set of instructions, to then select the first available, that is, non-used FM tuner, and issues a turn-on or enable command to the microprocessor control unit's selected device. This enable or turn-on command is preferably a request to a common power supply that in turn energizes the selected unit. The desired FM program signal is then directed to a dedicated amplifier that serves the subject room or area making the request. The user may choose from among different channels that are either manually pre-selected, pre-set, or randomly accessible by issuing another command to the microprocessor control unit which will in turn issue another command to the chosen device to move to the desired channel available.

Another station, or room, may concurrently request that either another device of the same or different type, such as a tape or compact disc player, be directed to the second station. If the request is for an FM tuner, the microprocessor control unit will poll the existing program source units available to the system to determine if there are any "free" FM tuners available for dedication to the second requesting station. Failing to find any such "free" FM tuners, the microprocessor control unit will direct the switching of the system to direct to the requesting station the last of the "in use" FM tuners.

For system devices other than FM tuners, the user can select a desired device by identifying the desired device by keyboard entry of instructions to the microprocessor control unit. The user can also either permit multiple access and control of the system device by other system users, or select a privacy option that would permit other system users to access the selected device's program, but not permit any control over the system device by another user.

Other additional features of a system embodying the present invention would preferably include a microprocessor control unit that includes an alarm system that will respond only to a particular room or area on a one-time or daily basis controlled by entry of data from the selected area's station. Such data can be stored in either the microprocessor control unit of the system or in a satellite memory in the station's control pad.

The novel features of construction and operation of the invention will be more clearly apparent during the course of the following description, reference being had to the accompanying drawings wherein has been illustrated a preferred form of the device of the invention and wherein like characters of reference designate like parts throughout the drawings.

DESCRIPTION OF THE PREFERRED EMBODIMENTS

Figure 1:
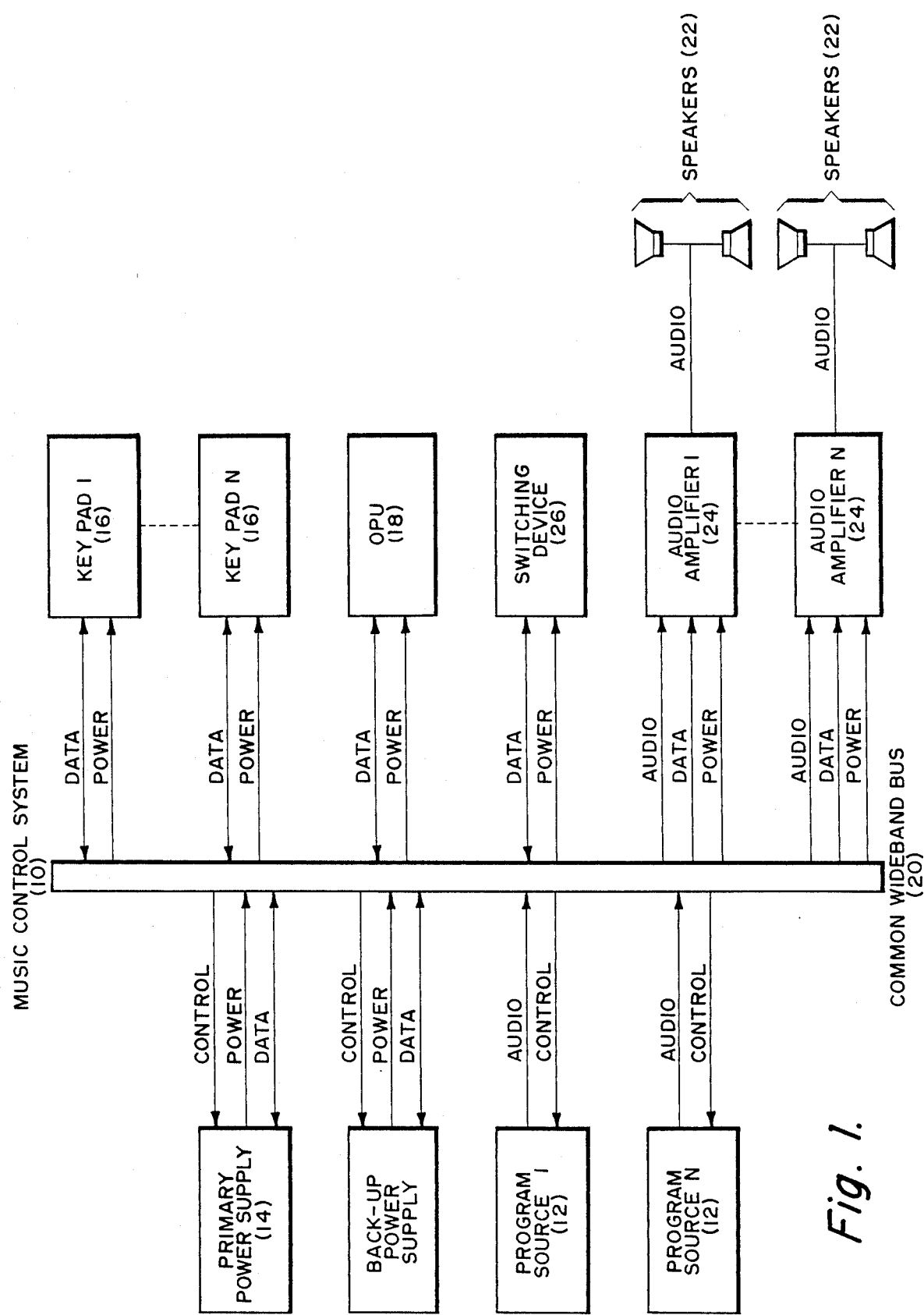
FIG. 1 constitutes a block diagram showing the general arrangement and construction of a system embodying this invention.
Figure 2:
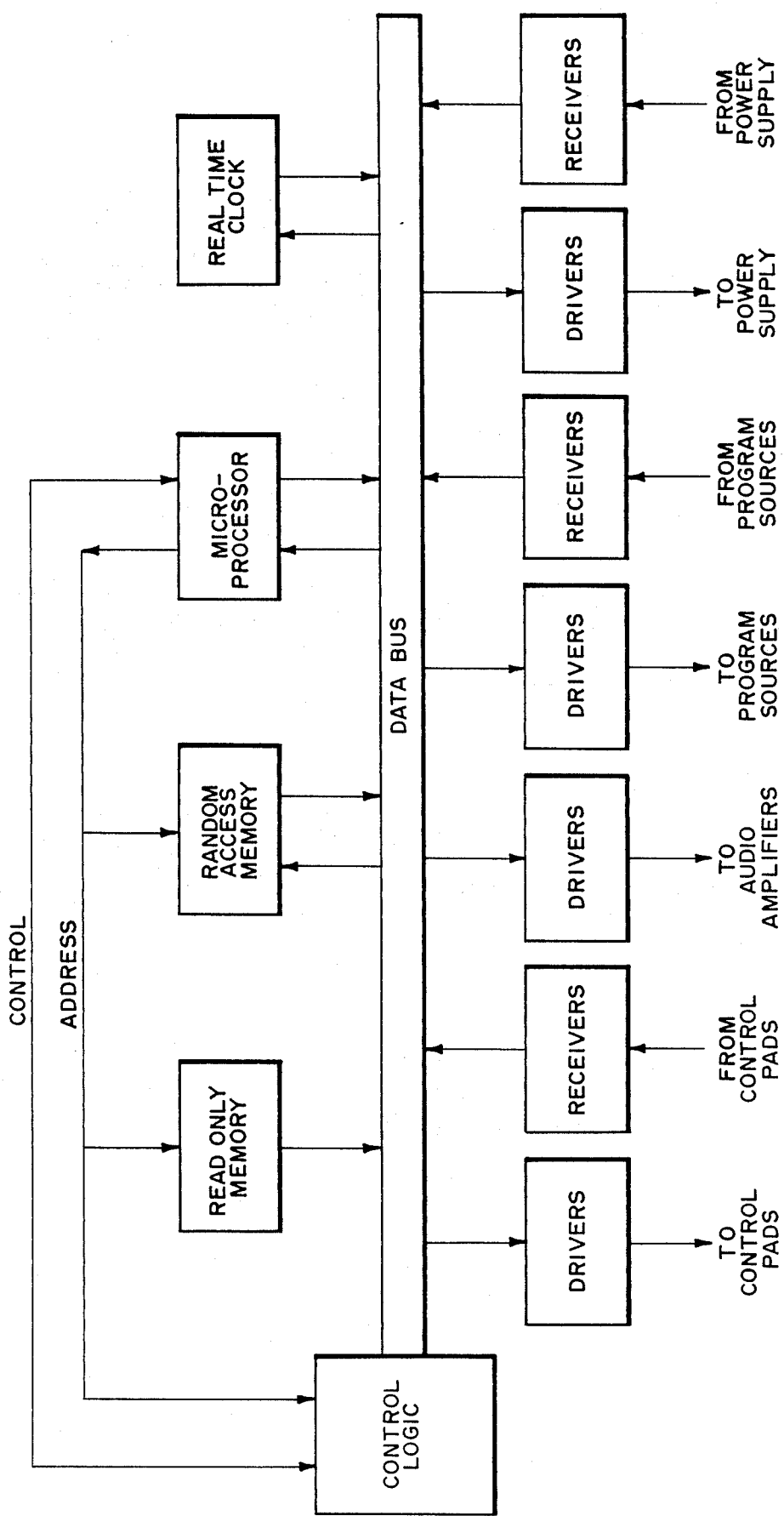
FIG. 2 constitutes a block diagram showing in greater detail than FIG. 1 the general arrangement and construction of the microprocessor control unit of a system embodying this invention.
Figure 3:
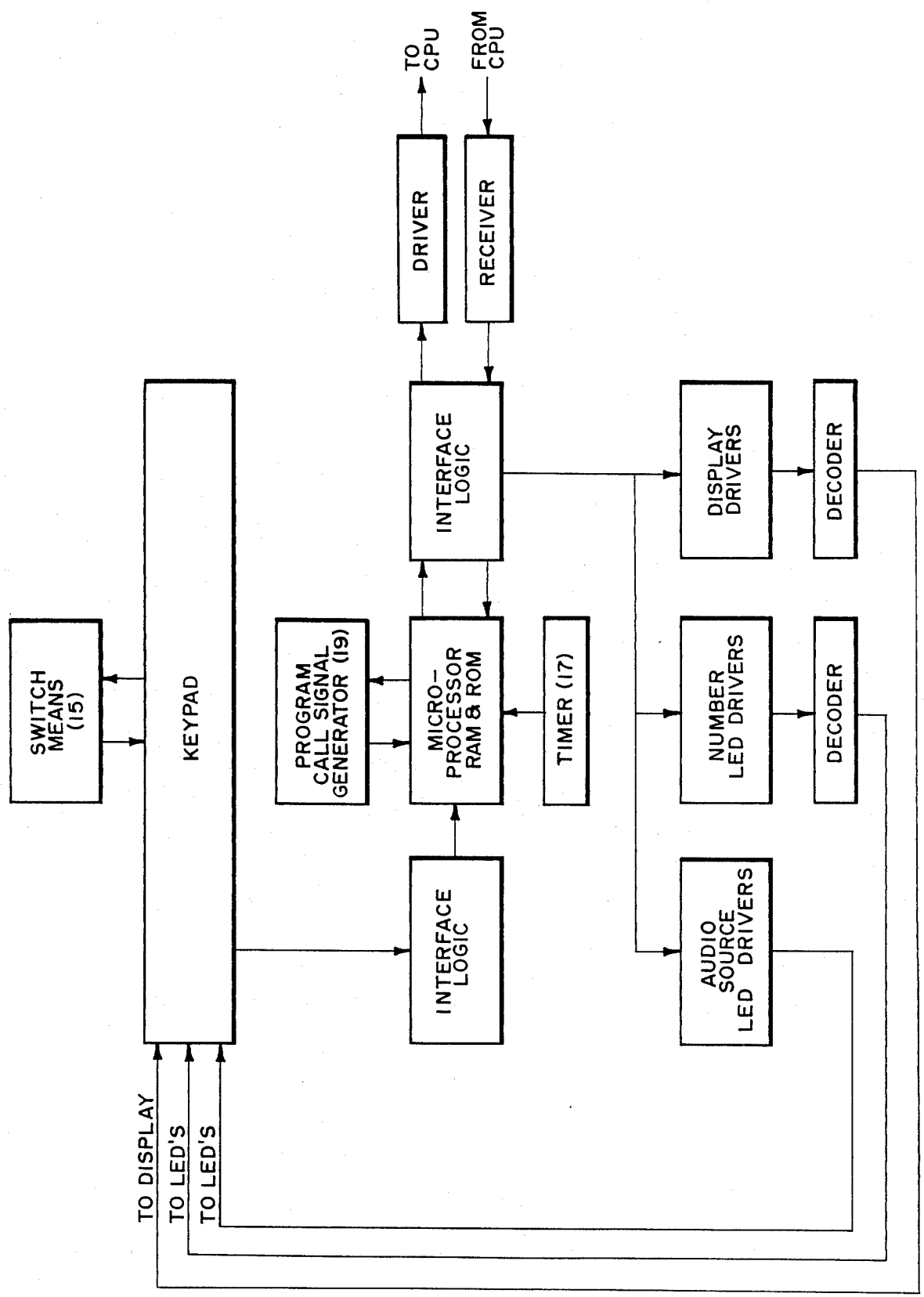
FIG. 3 constitutes a block diagram showing in greater detail than FIG. 1 the general arrangement and construction of the control pad member of a system embodying this invention.
Figure 4:
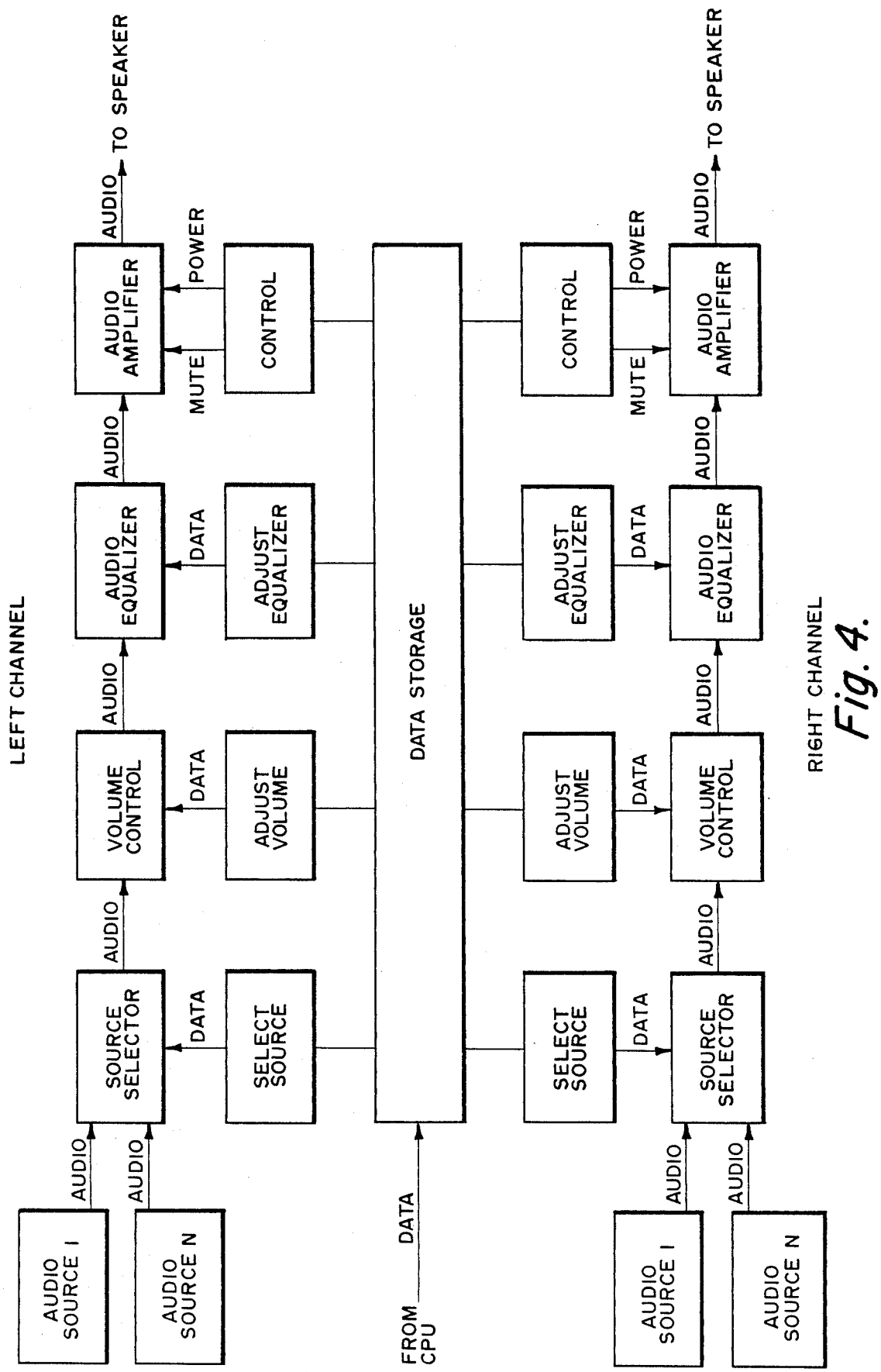
FIG. 4 constitutes a block diagram showing in greater detail than FIG. 1 the general arrangement and construction of the amplifier means portion of a system embodying this invention.

FIG. 1, and in greater detail in FIGS. 2, 3, and 4, show the general arrangement and construction of a system embodying the present invention. Referring now to these FIGS., the system illustrated is one that is preferable for use as a system for providing user selected audio programs to a plurality of uniquely identified stations in the system.

The system, generally refered to by the reference arrow 10, comprises a plurality of program sources 12. Preferably each of these program sources 12 can be either pre-set manually or randomly accessed by a user to a selected program signal or channel representing a desired audio channel, such as a local radio station. Program sources 12 may be radio tuners, tape players, compact disc players, or even television sets. Therefore, while the preferred embodiment of the invention being described herein is an audio system, it is also contemplated that a system embodying the present invention can also include video program sources as well as merely audio program sources.

A primary power supply unit 14 is adapted to be connected to a source of power (not illustrated, but, for example, an electrical wall outlet) and to each of the program sources 12. Power supply unit 14 is also adapted to respond to a power control signal to either enable or disable a selected program source 12 as is better described below.

A plurality of control pads 16 are each located at a respective one of uniquely identified stations throughout the area to be serviced by system 10. Each control pad 16 includes a plurality of switch means 15 and means 19 for generating a program call signal in response to the actuation of each switch means by a user.

Preferably control pads 16, shown in block diagrammatic form in FIG. 3, would employ a keypad such as a membrane touch, or pressure sensitive keypad that provides the user with individual keys that produce a tone or other binary data, suitable for encoding and decoding into binary coded signals for use by a microprocessor or central processing unit as is better described below for the transmission of data between control pads 16 and such central processing unit. Other non-membrane keypad devices such as toggle switches may also be used.

Control pads 16 also include means 19 for producing a program call signal having a first portion for uniquely identifying the station issuing the particular program call signal, a second portion identifying the type of program source being selected by the user at the particular station, and a third portion, that can identify a desired volume level or line level out for the program reproducing means, such as an audio speaker, associated with that particular station.

Each of the control pads 16 further includes timer means 17 and can further include local memory storage means.

The timer means can be a continuous clock/timer that both visually displays the time and provides a timing or strobe signal for us by the associated control pad for sequencing the execution of its data operations.

The local memory storage means that can be associated with each control pad 16 is preferably a Random Access Memory device with a battery backup, adapted to retain a set of user-stored instructions entered by using the individual keys found on the keyboard of each control pad 16.

The set of instructions contained in the memory portion of each control pad 16 is adapted to selectively control the program call signal generating means associated with each control pad 16 with reference to a timing standard provided by the clock/timer associated with the control pad.

The local memory storage means is preferably adapted to retain the set of user stored instructions for controlling the program call signal generating means for its associated control pad on a recurring periodic basis unless a second set of instructions is stored therein by the user.

Likewise, in the preferable embodiment of the invention being described, the set of user stored instructions at each control pad is also be capable of a single, non-repetitive execution as well as a daily, periodic execution.

In an alternative embodiment, the user-stored instructions entered at each station may be centrally stored in a memory storage portion or unit of the microprocessor control unit described below. With a centrally stored memory, there need only be a single battery backup for data protection.

A microprocessor control unit 18 is preferably coupled to power supply unit 14 and to control pads 16 by means of a wideband bus 20.

Microprocessor control unit 18 is shown in relation to the system 10 in FIG. 1, and in greater detail in the block diagram illustrated in FIG. 2.

Wideband bus 20 is generally connected to most individual element members of system 10 as shown in the FIGS. for transmitting and passing both data and power, as well as program signals throughout the system from program sources 12 to each station of the system 10, and between and among the individual system elements as better indicated herein.

Microprocessor control unit 18 is operable upon the receipt of a program call signal from each of the control pads 16, in accordance with a set of pre-set instructions for:

(1) generating the power control signal to enable or disable a selected program source 12 based upon the second portion of the program call signal;

(2) generating a routing signal for use by a switching device based upon the first portion of the program call signal. This routing signal is preferably generated by polling through the type of program sources identified by the first portion of said program call signal, and generating the routing signal to connect the first non-connected program source of the identified type to the selected transducing means. If all of the particular type of individual program sources identified by the program call signal are connected, then the routing signal should connect the selected transducing means and station to the last of the identified type of program sources polled by the microprocessor control unit; and, (3) generating a volume level control (or line level out) signal for use in driving associated equipment such as an additional amplifier device or a transducing unit, such as a speaker associated with the particular station making the program call, based upon the third portion of the program call signal.

One preferable transducing unit, shown in the FIGS., is a pair of audio speakers 22 located at or near each station of the system.

Each of these transducing units or audio speakers 22 is coupled to microprocessor control unit 18 and is located at the system stations for converting a received program signal to a sensibly perceptible program for the requesting user.

Each of the audio speakers 22 is adapted to respond to the volume level control (or line level out) signal for controlling the volume level of the sensibly perceptible program at the station.

Likewise, each of the audio speakers 22 includes amplifier means 24 for amplifying the volume level of the selected program signal.

Audio speaker units 22 are adapted for providing the sensibly perceptible program for the enjoyment of the requesting user at that station.

Switching unit 26 is coupled to microprocessor control unit 18, to program sources 12, and audio speaker units 22, by means of wideband bus 20 for the transmission and reception of data and control signals throughout system 10.

Switching unit 26 responds to received routing signals to connect a selected one of the program sources 12 to at least one of the audio speaker units 22 located at a selected station of the system.

Figure 5:
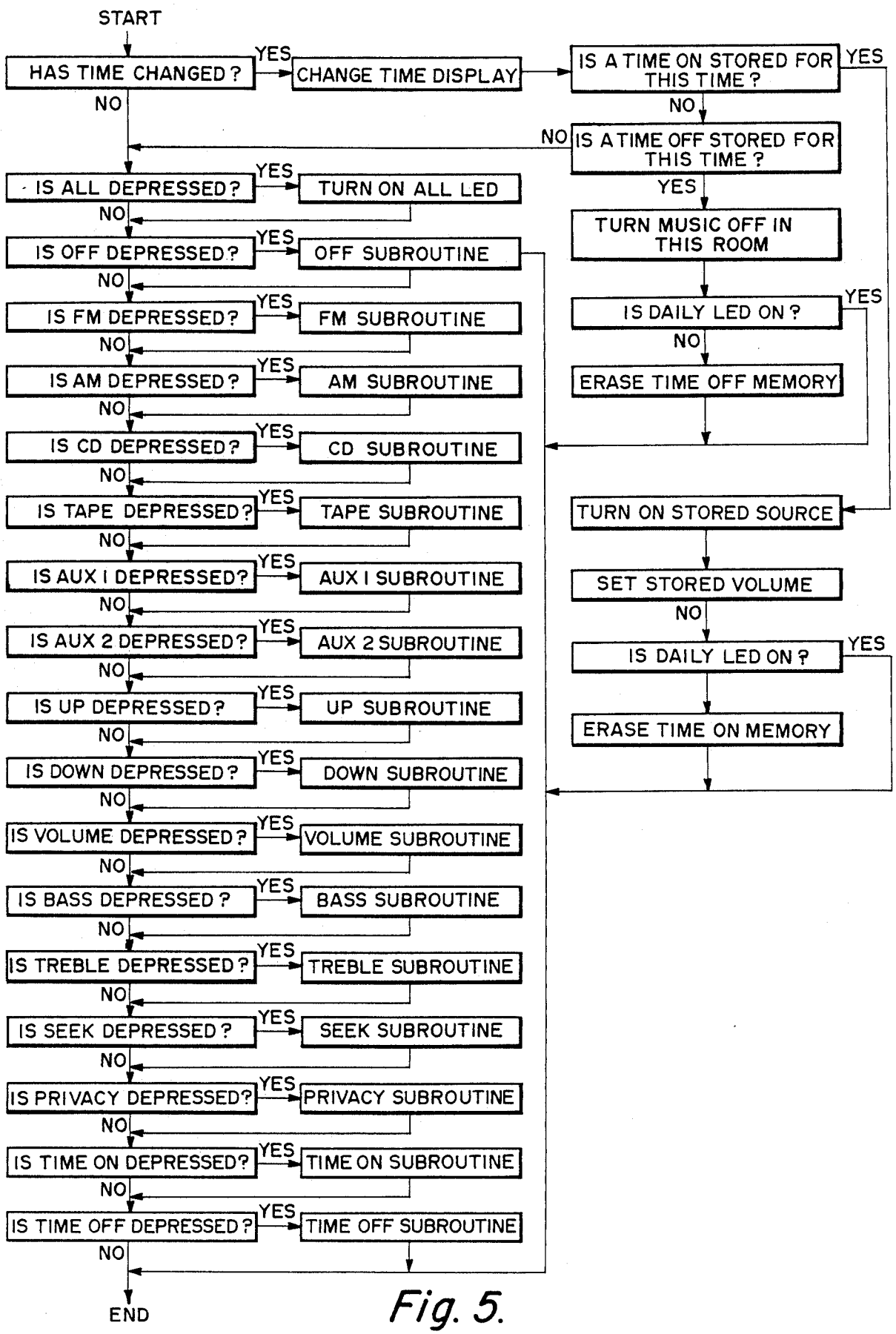
FIG. 5 constitutes a flow chart diagram showing the main logic flow of the microprocessor control unit of a system embodying this invention.
Figure 6:
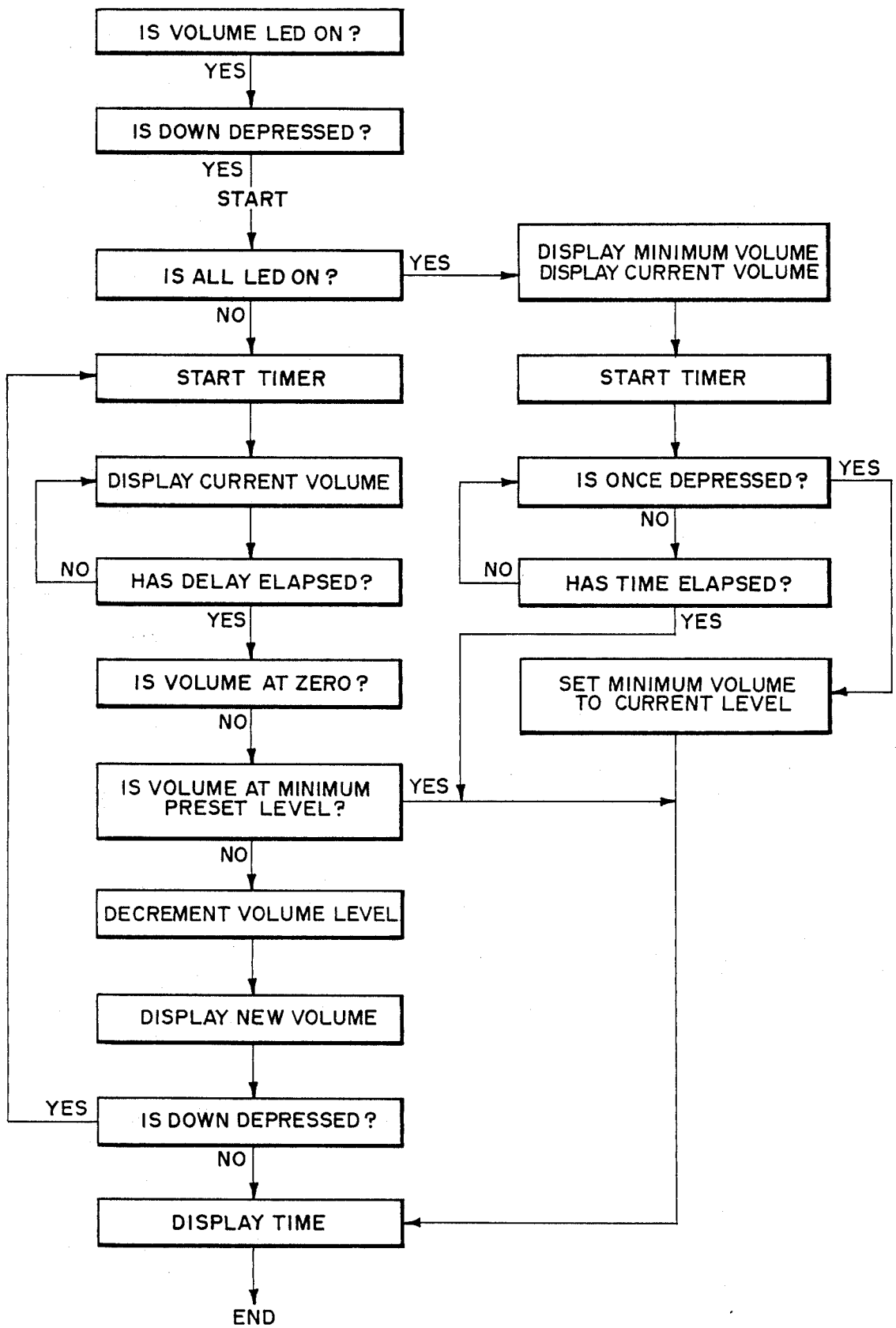
FIG. 6 constitutes a flow chart diagram showing the logic flow of the microprocessor control unit of a system embodying this invention in responding to a request to lessen the volume level at a particular requesting station.

FIGS. 5 and 6 provide examples of a user supplied instruction set for use by the microprocessor control unit 18 for overall control of a system embodying the invention, such as that system 10 described here, and for controlling the volume or line level out of a program signal.

Specifically, as shown in the logic flow diagram of the instruction set, the instructions first require that the microprocessor control unit reference the timing standard for the system to determine whether the time has changed. If so, the microprocessor control unit is branched to a procedure that performs certain housekeeping chores such as changing the time display, checking to see if a repetitive task is required and performing that repetitive task if so required.

If the time reference has not changed, then the microprocessor control unit is directed to commence a series of checks to determine the nature of the commands being presented it.

The microprocessor control unit begins its checks by determining whether the program signal should be terminated from transmission to that particular station.

If not, it then checks whether scanning or a particular type of program source device, such as an FM tuner, AM radio, compact disc player, tape player or certain auxiliary type devices is being requested by the user.

Next, it determines whether the user is expressing a preference concerning the volume level of the program signal. If so, it commences to branch to either a volume up or volume down subroutine, indicated in greater detail in FIG. 6.

Finally, the microprocessor control unit is directed to determine if the user is attempting to store instructions for either one time or repetitive daily execution by the system.

Once it has parsed these instructions, the microprocessor control unit is directed to loop back to the beginning of the instruction set and continue processing the instructions set so that it can respond to any additional or continuing instructions it may receive.

FIG. 6 provides an example of one of the subsets of instructions that would be processed by the microprocessor control unit. FIG. 6 shows the logic flow diagram for the instruction set forming the volume down subroutine.

In FIG. 6, the microprocessor control unit has branched to the start point from its activities better described above and shown in FIG. 5.

The microprocessor control unit commences its activity by first checking whether the user desires to change the existing minimum volume parameters already stored in its memory, and so visually displays these parameters at the station's control pad for the user's inspection.

If the microprocessor control unit then receives the user's instructions to modify the existing stored minimum volume parameters, it proceeds to issue various control signals (such as line level out signals) to the appropriate amplifier devices to vary the volume of the program signal. After an appropriate reference to the timing standard to insure a known volume level, it displays the new volume level for the user's inspection.

Finally, if it detects a signal instructing it to continue to lessen the volume level of the program signal, it loops back to the beginning of the instruction set. If no such signal is found, the microprocessor control unit then displays the timing reference for the user and returns to the main program logic flow as shown in FIG. 5.

A subroutine instruction set for increasing the volume level of the program signal would be similar to the above described subroutine instruction set for decreasing the volume set with only the change in volume level signal being opposite in direction, i.e, in one instance the control signal to the amplifying unit would increase the signal strength while in the other instance to decrease the signal strength.

The other subsets of instructions that would be used by the microprocessor control unit are not shown in the FIGS., but would be similar in that they contain a sequence of tests and responses to received user instructions detected from signals generated a the control pads of the system.

The invention described above is, of course, susceptible to many variations, modifications and changes, all of which are within the skill of the art. It should be understood that all such variations, modifications and changes are within the spirit and scope of the invention and of the appended claims. Similarly, it will be understood that it is intended to cover all changes, modifications and variations of the example of the invention herein disclosed for the purpose of illustration which do not constitute departures from the spirit and scope of the invention.

What is claimed is:

1. A system for providing user selected programs to a plurality of uniquely identified stations, said system comprising:

a plurality of program sources each adapted to be pre-set manually to a selected program signal by a user;

a power supply unit adapted to be connected to a source of power and to each of said program sources, said power supply unit being operable in response to a power control signal to either enable or disable a selected one of said program sources;

a plurality of control pads, each located at a respective one of the plurality of uniquely identified stations, each pad including a plurality of switch means and means for generating a program call signal in response to the actuation by a user of each switch means, and further including means for producing said program call signal wherein said program call signal has a first portion uniquely identifying the station generating said program call signal, a second portion identifying a type of program source being selected by said user, and a third portion identifying a volume or line level out selected by said user, said control pads each further including timer means and memory storage means, said memory storage means adapted to retain a set of instructions applied thereto by said user using said plurality of switch means associated with each said control pad, and said set of instructions being operable to selectively control said program call signal generating means associated with each said control pad, relative to a timing standard provided by said control pad timer means, said memory storage means adapted to retain a user stored instruction set for controlling said program call signal generating means on a recurring periodic basis unless a superseding set of instructions is stored therein by a user;

a microprocessor control unit coupled to said power supply unit and to said plurality of control pads, operable in response to said program call signal from each of said control pads, in accordance with a set of pre-set instructions for:

(1) generating power control signals to enable or disable a selected program source based upon said second portion of said program call signal, (2) producing a routing signal for use by a switching device based upon said first portion of said program call signal, by polling through the type of program sources identified by said first portion of said program call signal, and for generating said routing signal to connect the first non-connected program source of said identified type to selected transducing means, and, if all of the individual program sources of the type identified by said program call signal are connected, then to the last of the program sources of said identified type polled by said microprocessor control unit, and (3) generating a volume or line level out control signal based upon said third portion of said program call signal for use by a plurality of transducing means;

said plurality of transducing means coupled to said microprocessor control unit, each located at a respective one of the stations for converting received program signals to a sensibly perceptible program for said user, each of said transducing means being operable in response to an applied volume or line level out control signal to control the volume level of the sensibly perceptible program being produced, each said transducing means including amplifier means for changing the volume or line level out of the applied program signal, and an audio speaker unit for generating the audio portion of the sensibly perceptible program being generated;

said switching means coupled to said microprocessor control unit, to said plurality of program sources, and to said plurality of transducing means, for responding to said routing signal to connect a selected one of said plurality of program sources to at least one selected transducing means.

2. A system for providing user selected programs to a plurality of uniquely identified stations, said system comprising:

a plurality of program sources each providing a user selectible program signal;

a power supply unit applied to be connected to a source of power and to each of said program sources, said power supply unit adapted to respond to a power control signal to either enable or disable a selected program source;

a plurality of control pads, each located at a respective one of the uniquely identified stations, each pad including a plurality of switch means and means for generating a program call signal in response to the actuation of each switch means by a user and further including means for producing a program call signal having a first portion uniquely identifying the station generating said program call signal, a second portion identifying the type of program source being selected by said user, and a third portion identifying a volume or line level out selected by said user;

a microprocessor control unit coupled to said power supply unit and to said plurality of control pads, operable upon the receipt of a program call signal from each of said control pads, in accordance with a set of pre-set instructions for:

(1) generating said power control signal to enable or disable a selected program source based upon said second portion of said program call signal, (2) generating a routing signal for use by a switching device based upon said first portion of said program call signal, (3) generating a volume level control signal for use by a plurality of transducing means based upon said third portion of said program call signal;

said plurality of transducing means coupled to said microprocessor control unit, each located at a respective one of said stations for converting a received one of said plurality of program signals to a sensibly perceptible program for said user, each said transducing means adapted to respond to said volume or line level out control signal to control the volume level of said sensibly perceptible program at its station;

said switching means coupled to said microprocessor control unit, to said plurality of program sources, and to said plurality of transducing means, adapted to respond to said routing signal to connect a selected one of said plurality of program sources to at least one of a selected transducing means.

3. A system as recited in claim 2 wherein each of said control pads further includes timer means and memory storage means, said memory storage means adapted to retain a set of instructions stored therein by said user using said plurality of switch means associated with each said control pad, and said set of instructions adapted to selectively control said program call signal generating means associated with each said control pad with reference to a timing standard provided by said timer means.

4. A system as recited in claim 3 wherein said memory storage means is adapted to retain said set of user stored instructions for controlling said program call signal generating means on a recurring periodic basis unless a new set of instructions is stored therein by said user.

5. A system as recited in claim 2 wherein said microprocessor control unit is further operable upon the receipt of said program call signal from each of said control pads, in accordance with said set of pre-set instructions, for polling through the type of program sources identified by said first portion of said program call signal, and generating said routing signal to connect the first non-connected program source of said identified type to said selected transducing means, and, if all of the individual program sources identified by said program call signal are connected, to the last of said identified type of program sources polled by said microprocessor control unit.

6. A system as recited in claim 2 wherein each of said plurality of program sources is pre-set manually by said user to a selected program signal.

7. A system as recited in claim 2 wherein each said transducing means includes amplifier means for amplifying the volume or line level out of the selected program signal, and an audio speaker unit adapted for providing said sensibly perceptible program at its station.

8. A system as recited in claim 2 wherein said switching means is adapted to connect a selected one of said plurality of program sources to a selected transducing means.

9. A system as recited in claim 2 wherein each of said plurality of program sources is randomly accessible by said user to a selected program signal.

10. A system as recited in claim 2 wherein said microprocessor control unit includes timer means and memory storage means, said memory storage means adapted to retain, for each of said control pads, a set of instruction stored therein by said user using said plurality of switch means associated with each of said control pads, and said set of instructions adapted to selectively control said program call signal generating means associated with each of said control pads with reference to a timing standard provided by said timer means.

11. A system as recited in claim 10 further including a battery powered back-up power supply unit adapted to be connected to said memory storage means of said microprocessor control unit, said battery powered back-up power supply unit adapted to maintain said set of instructions stored therein.

12. A system as recited in claim 10 wherein said memory storage means is adapted to retain said set of user stored instructions for controlling said program call signal generating means on a recurring periodic basis unless a new set of instructions is stored therein by said user.

* * * * *